(12) United States Patent
Hsu et al.

(10) Patent No.: US 6,323,086 B2
(45) Date of Patent: *Nov. 27, 2001

(54) FLASH MEMORY STRUCTURE USING SIDEWALL FLOATING GATE HAVING ONE SIDE THEREOF SURROUNDED BY CONTROL GATE

(75) Inventors: Louis L. Hsu, Fishkill; Jack A. Mandelman, Stormville, both of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/298,920

(22) Filed: Jun. 15, 1998

(51) Int. Cl.$^7$ ................................................... H01L 21/336
(52) U.S. Cl. ............................................ 438/257; 438/593
(58) Field of Search ................................. 438/257, 263, 438/264, 265, 267, 593, 594

(56) References Cited

U.S. PATENT DOCUMENTS

| 5,068,707 | * | 11/1991 | Pors et al. ............................. 257/311 |
| 5,108,939 | * | 4/1992 | Manley et al. ......................... 439/264 |
| 5,115,288 | * | 5/1992 | Manley .................................. 257/316 |
| 5,304,505 | * | 4/1994 | Hazani .................................. 438/257 |
| 5,402,374 | * | 3/1995 | Tsuruta et al. ........................ 257/316 |
| 5,538,833 | * | 7/1996 | Ferguson et al. ......................... 430/5 |
| 5,824,584 | * | 10/1998 | Chen et al. ............................ 438/267 |
| 5,899,706 | * | 5/1999 | Kluwe et al. .......................... 438/599 |
| 6,015,991 | * | 1/2000 | Wheeler et al. ....................... 257/336 |
| 6,054,345 | * | 4/2000 | Alsmeiser et al. .................... 438/267 |

FOREIGN PATENT DOCUMENTS 4-04-079369 * 3/1992 (JP) .

* cited by examiner

*Primary Examiner*—Michael Trinh
(74) *Attorney, Agent, or Firm*—McGinn & Gibb, PLLC

(57) ABSTRACT

A flash memory and a method of forming a flash memory, includes forming a polysilicon wordline on a substrate, the wordline having first and second sidewalls, the first sidewall being tapered, with respect to a surface of the substrate, to have a slope angle and the second sidewall having a slope angle greater than the slope angle of the first sidewall. Thereafter, a polysilicon spacer is formed on the second sidewall such that the spacer includes only one side which abuts the second sidewall of the polysilicon wordline.

12 Claims, 5 Drawing Sheets

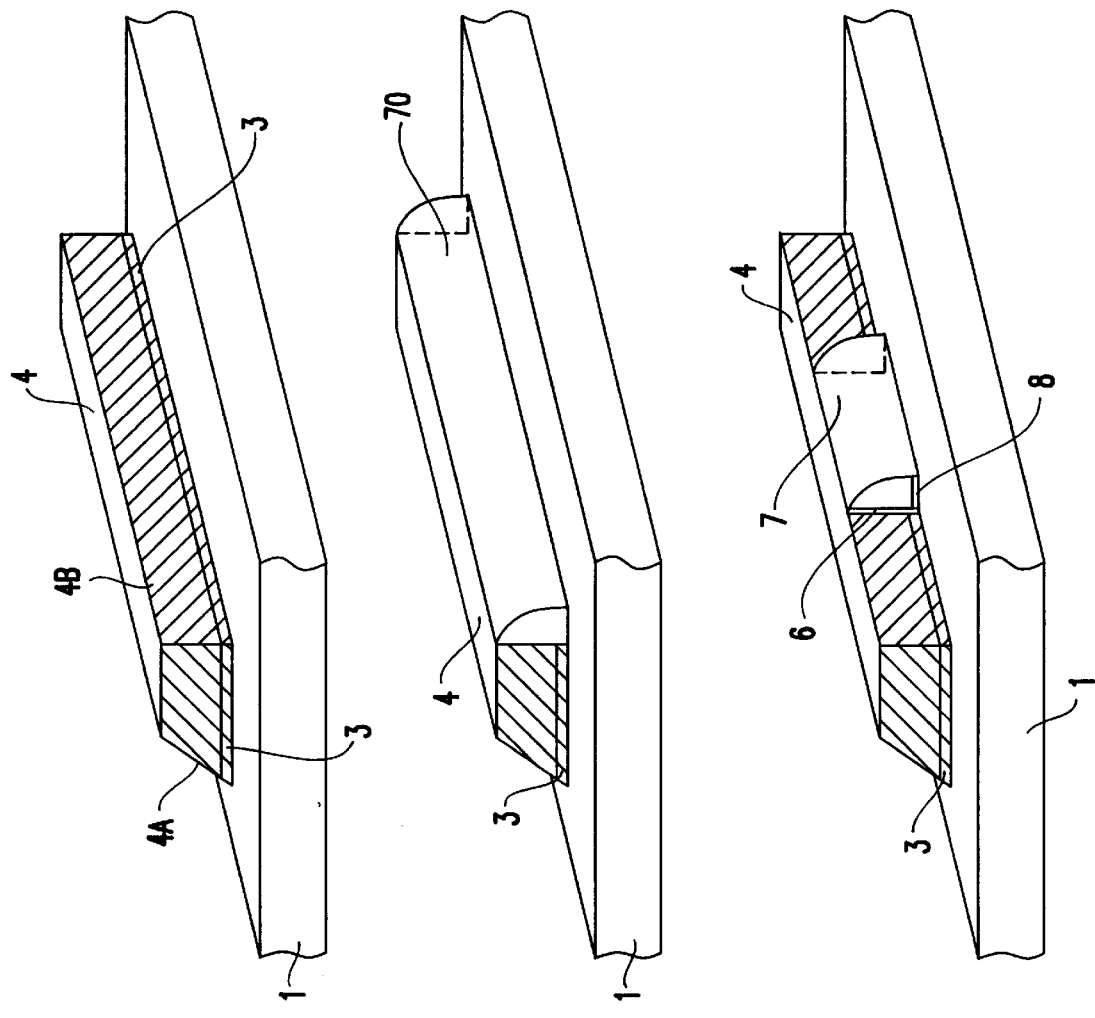

FLASH MEMORY STRUCTURE USING SIDEWALL FLOATING GATE HAVING ONE SIDE THEREOF SURROUNDED BY CONTROL GATE

CROSS-REFERENCE TO RELATED APPLICATION

The present application is related to U.S. patent application Ser. No. 09/097,515, entitled "FLASH MEMORY STRUCTURE USING SIDEWALL FLOATING GATE AND METHOD FOR FORMING THE SAME", filed on Jun. 15, 1998, U.S. Pat. No. 6,252,271, to Gambino et al., assigned to the present assignee, and incorporated herein by reference.

BACKGROUND OF THE INVENTION

1. Field of the Invention

The present invention generally relates to a flash memory and a method of forming a flash memory, and more specifically a method of forming a flash memory cell using an asymmetric control gate with a sidewall floating gate.

2. Description of the Related Art

A flash memory is unique in providing fast compact storage which is both nonvolatile and rewritable.

In a flash memory, the threshold voltage Vt for conduction of a field effect transistor (FET) changes state depending upon the amount of charge stored in a floating gate (FG) part of the FET. The floating gate is a charge storing region which is isolated from a more traditional gate conductor CG (control gate or "wordline") by a thin dielectric. The states of the Vt change with the amount of charge stored by the FG.

Since the FG directly controls conductivity between source and drain in a channel, the state of a FG memory cell is determined by applying certain voltages to the source or drain of the FET and observing whether the FET conducts any current.

Flash memory cells with a sidewall floating gate occupy a smaller area than those with conventional (layered) floating gates. For example, in U.S. Pat. No. 5,115,288, sidewall gates were formed on one side of the wordline by employing an extra mask. Sidewall spacers were formed on both edges of the wordline, then removed along one of the edges using the extra mask and an etching operation. Thus, the conventional approach uses a trim mask to define the floating gate.

However, this approach is expensive and requires good control of the overlay for the spacer removal mask.

Other conventional structures also are known. For example, in one structure, polysilicon spacers on both sidewalls are used for the floating gate. One spacer sits on top of the tunnel oxide area for programming, and the other one is called "added on floating gate". Both spacers are linked by a polysilicon body. However, a large cell size results.

In a second conventional structure, only one polysilicon spacer is used as the floating gate. A mask must be aligned to the top of the control gate, to remove the other floating gate spacer. Hence, the control gate cannot be small, since, otherwise, any misalignment will cause a problem. Therefore, this cell has difficulty in being down-scaled.

In yet another conventional structure, similar to the second conventional structure described above, a mask is needed to remove a sidewall spacer floating gate. Further, this spacer has a reentrance corner which is very difficult to be completely removed.

Thus, the conventional methods require extra process steps, material and more precise lithographic alignment, thereby resulting in increased manufacturing costs.

SUMMARY OF THE INVENTION

In view of the foregoing and other problems of the conventional systems and methods, it is an object of the present invention to provide a method for forming a flash memory structure in which there is no (or at the very least minimal) alignment concern for high density device integration.

Another object is to provide a method for forming a flash memory which may utilize phase-shift mask techniques.

In a first aspect of the present invention, a method of forming a flash memory includes forming a polysilicon wordline with a first sidewall on a first side, the first sidewall having a predetermined slope; and forming a polysilicon spacer on a second sidewall, that is less sloped (or not sloped at all) than the first sidewall, while the polysilicon on the first sidewall is being removed (e.g., by being isotropically etched away), the polysilicon spacer abuts the polysilicon wordline at only one side. The step of forming the wordline includes using a phase-shift mask.

In a second aspect of the present invention, a flash memory is provided which includes a wordline (e.g., control gate) with a slope on a first side and a vertical wall on a second side prior to deposition of polysilicon spacer material. The wordline abuts the floating gate on only one side, and the floating gate is self-isolated from adjacent floating gate devices by being discretely formed along the gate conductor.

With the unique and unobvious aspects and features of the present invention, a flash memory is formed which may or may not include a phase-shift mask, which includes less steps and material, an in which the control gate CG abuts the floating gate (FG) on one side thereof. Additionally, the FG is fabricated to an extremely small size and is self-isolated from adjacent FG devices by the gate conductor.

Further the simple process steps and self-alignment scheme of the present invention result in not only high device packing density but also decreased costs.

BRIEF DESCRIPTION OF THE DRAWINGS

The foregoing and other objects, aspects and advantages will be better understood from the following detailed description of a preferred embodiment of the invention with reference to the drawings, in which:

FIGS. 8A–8C are perspective views showing forming a gate structure with tapered and vertical sidewalls, according to the method of the present invention, with FIG. 8C showing the floating gate spacers formed in the vertical sidewall areas;

DETAILED DESCRIPTION OF A PREFERRED EMBODIMENT OF THE INVENTION

Figure 1:
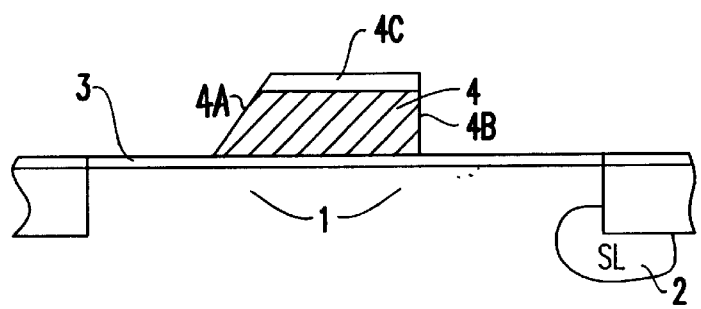
FIGS. 1–7 illustrate a method of forming a semiconductor device, such as a flash memory, according to the present invention.

Referring now to the drawings, and more particularly to FIGS. 1–7, there is shown a preferred embodiment of the present invention.

Generally, the present inventors have discovered a solution to the above-mentioned problems of the conventional methods and structures, which is to make a wordline (or control gate) that has a sloped sidewall on one edge (side) which has a slope which is less than that of a second sidewall.

For purposes of the present invention, "slope" is defined as the angle formed by the sidewall with the surface of the underlying substrate upon which the sidewall is formed. Thus, a slope which is relatively gradual (e.g., 45 degrees) would be less than a slope which was more extreme (e.g., 90 degrees) typically formed by what is referred to as a "vertical sidewall".

Forming the wordline having a sloped sidewall can be achieved with an appropriate phase shift mask as described below in the first preferred embodiment by using a trim mask for trimming and selectively forming a spacer for the floating gate. Because of the tapered (sloped) sidewall, spacers are formed on only the non-sloped edge of the wordlines.

In the present invention, floating gate sidewalls can be selectively formed along the non-sloped edge of the device. A trim mask is used, so that the floating gates are isolated from each other. However, the alignment of the trim mask is less critical (larger overlay tolerance) than that of the sidewall removal mask used in the conventional methods.

First, referring to FIG. 1, in step 1, a silicon substrate 1 with well and isolation structures is formed which includes an implanted $n^+$ diffusion region 2. The buried $n^+$ diffusion region 2 is used for the source connection of the cells. It is noted that, instead of forming the buried interconnect by $n^+$ diffusion, $p^+$ diffusion also can be employed. Alternatively, the buried interconnect may be formed of a metal line such as tungsten or silicide, as long as low resistivity for the wire results.

In step 2, after a gate oxide 3, preferably formed by thermal oxidation and having a thickness within the range of 6.0 nm to 12 nm, is formed over the substrate 1, and a gate material 4, preferably formed of polysilicon doped with $n^+$ or $p^+$-type dopant, is deposited.

A special lithographic patterning, as described in U.S. patent application Ser. No. 09/010,611, filed on Jan. 22, 1998 by the assignee of the present application, IBM Corporation, and entitled "MULTI-PHASE MASK", incorporated herein by reference, is performed so that after gate reactive ion etching (RIE), one sidewall 4A of the gate 4 is "vertical" and the other sidewall 4B of the gate 4 is "tapered", as shown in FIG. 1.

For purposes of the present application, a "vertical" sidewall is defined as the sidewall 4B being substantially perpendicular to the surface of the substrate 1 upon which the gate 4 is formed. A "tapered" sidewall is defined as the sidewall 4A having a surface which is other than substantially perpendicular to the surface of the silicon substrate 1, and more specifically as having a surface forming an angle less than 90 degrees with respect to the surface of the substrate 1 upon which the gate 4 is formed. A preferred angle of taper is within a range of substantially 45 to 65 degrees. This range is preferable since an angle less than 45 degrees is not generally reproducible, whereas an angle greater than 65 degrees may form sidewall spacers.

It is noted that, as described above, the invention provides a tapered sidewall having a predetermined "slope". Further, it is noted that the second sidewall need not be vertical, but instead may simply have a greater slope than that of the tapered sidewall. As described above, the slope is defined as the angle formed by the sidewall with the surface of the underlying substrate upon which the sidewall is formed. Thus, the slope of the tapered sidewall is less than that of the second sidewall (e.g., which in the exemplary embodiment may be substantially vertical but at the very least has a greater slope (angle) than the tapered sidewall). A nitride cap layer 4C is shown in FIG. 1 for protecting the gate stack during etching. Therefore, the gate stack will not be etched.

Figure 2:
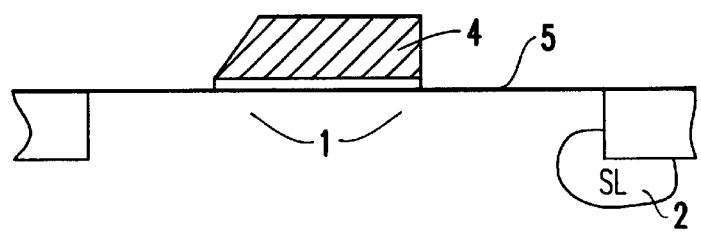

In step 3, as shown in FIG. 2, after selectively removing the gate oxide 3 in the exposed area, a layer of thin nitride 5 is deposited in-situ, which will become the gate dielectric for the floating gate. For example, a preferred nitride would be chemical vapor deposition (CVD) nitride having a thickness of preferably substantially within a range of 6–12 nm.

The in-situ nitride deposition ensures that there is no native oxide underneath the nitride layer, which would degrade the gate oxide. Specifically, right after the removal of gate oxide 3, the wafer should remain in an environment where no oxygen is present. Otherwise, a native oxide may be formed, in which case the effective gate oxide thickness is not controlled or is non-uniform.

Figure 3:
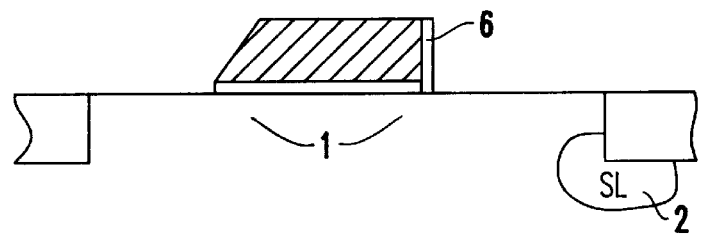

Thereafter, in step 4, as shown in FIG. 3, thermal oxidation is performed so that, at the interface of the nitride 5 and the polysilicon gate 4 and silicon substrate 1, a thin layer of oxide 6 is grown. Typically, the thickness of this oxide 6 is in the range of 2 to 5 nm.

The oxidation is performed such that oxygen is diffused through the nitride, with the interface of the nitride/silicon substrate being converted into oxide, so that there will no dangling bond, for reducing interface trap density for better oxide quality. The oxide formed underneath the nitride has a very uniform thickness (e.g., substantially within a range of 2–5 nm).

Figure 4:
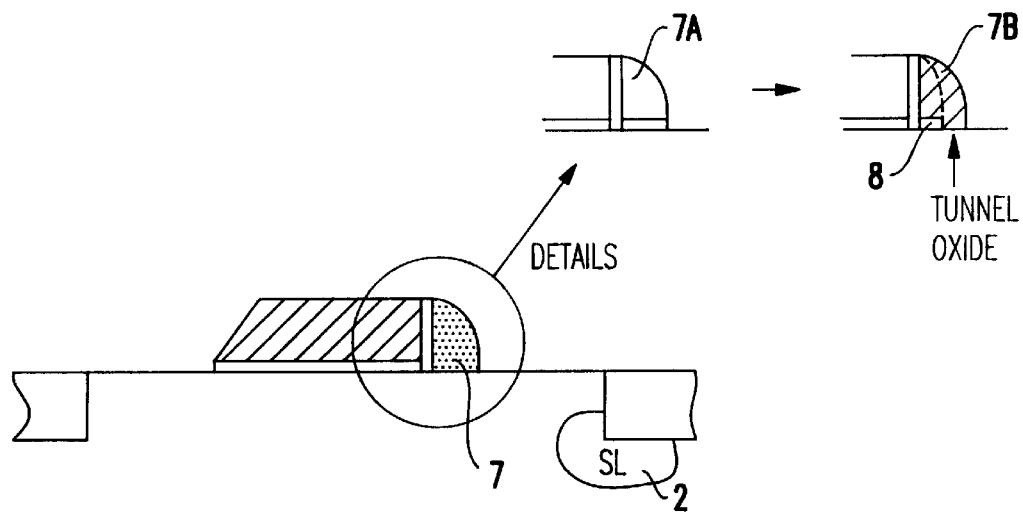

Then, in step 5, as shown in FIG. 4 (and as described in further detail below with regard to FIGS. 8A–8C), a discrete sidewall floating gate 7 is formed using a spacer process (e.g., a polysilicon deposition followed by RIE, to form a polysilicon spacer). Floating gates 7 are isolated from one another, after a mask trimming process is completed. To provide a tunneling region 8 underneath the floating gate 7 (e.g., as shown in the details of FIG. 4), a double spacer process may be used. The spacer process and the double spacer process are described below.

That is, the first spacer 7A is formed on top of the nitride/oxide surface. Then, the nitride layer is removed by dry or wet etching, leaving the thin oxide layer, having a thickness, for example, in the range of 2 to 5 nm, as the tunnel oxide layer before forming the second polysilicon spacer 7B.

Some advantages of the double spacer process are that: (1) the tunneling oxide is located away from the gate (e.g., the control gate 4) and close to the source area; and (2) the nitride between the control gate 4 and floating gate 7 is protected by the first spacer 7A during the nitride removal step.

Figure 5:
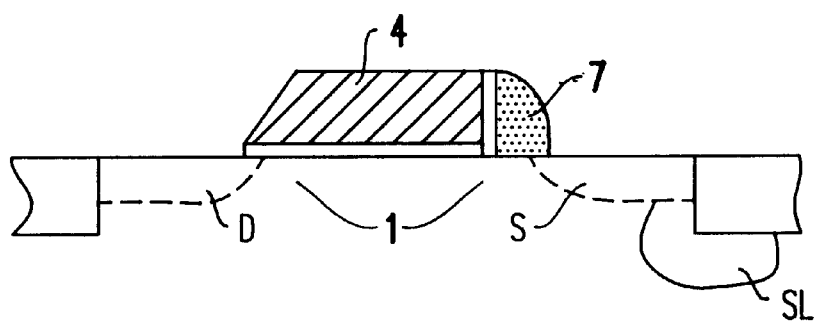

Thereafter, in step 6 (and as shown in FIGS. 8A–8C), a trim mask or the like is used to form the floating gates where desired, and thereby to isolate the floating gates from each other. Additionally, the source and drain implants S, D, are performed using conventional processing, as shown in FIG. 5 and as well-known in the art.

Figure 6:
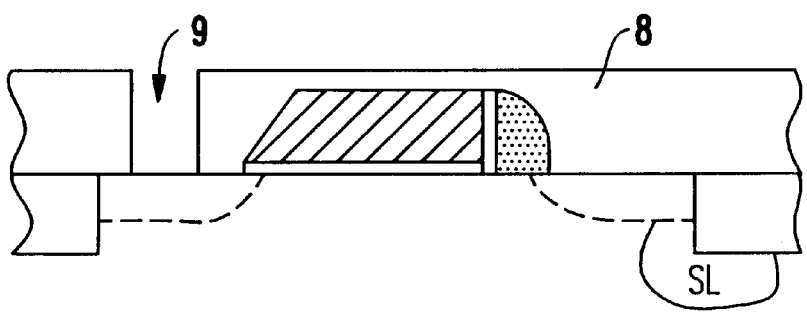
Figure 7:
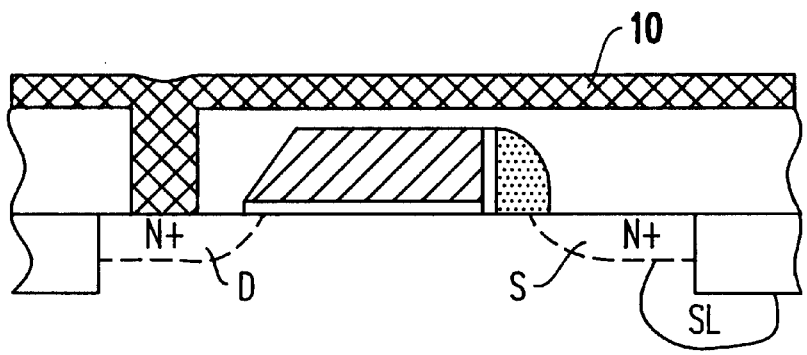

In step 7, as shown in FIGS. 6 and 7, respectively, a dielectric 8 and interconnects/vias 9 for forming bitlines 10 are formed by conventional processing. The dielectric may include TEOS, CVD oxide and/or doped glass having a thickness of, for example, substantially within a range of about 100 to 1000 nm.

A three-dimensional diagram of the gate structure with tapered and vertical sidewalls 4A, 4B, respectively, is shown in FIG. 8A, and the corresponding cross-sectional view along the X–X' direction is shown in FIG. 3. The gate oxide 3 is present at the interface of control gate 4 and the silicon substrate 1.

The discrete floating gate spacers are formed preferably as block polysilicon material 70 in the vertical sidewall areas, as shown in FIG. 8B, and then trimmed by a trim mask 14 (shown in FIG. 9B), to leave the desired discrete floating gate in FIG. 8C (e.g., only one spacer is shown for brevity and ease of understanding).

Trimming is performed by using an isotropic etch and selectively removing the exposed polysilicon sidewall spacer, and stopping at the substrate. The gate stack is protected during etching by the nitride cap 4C shown in FIG. 1, for example, and therefore will not be etched.

More specifically, the present invention uses a phase-shift mask technique and preferably a trim mask, to selectively form floating gate sidewalls along the non-sloped (e.g., vertical sidewall) edge of the device. The trim mask is used, so that the floating gates are isolated from each other. However, the alignment of the trim mask is less critical (larger overlay tolerance) than that of the sidewall removal mask used in the conventional methods.

In step 6 and as shown in FIGS. 8A–8C, a trim mask or the like is used to form the floating gates where desired, and thereby to isolate the floating gates from each other.

FIGS. 8A–8C show a three-dimensional diagram of the gate structure with tapered and vertical sidewalls. The floating gates are formed in the vertical sidewall areas, as shown, and then, with use of the trim mask, the floating gate material is trimmed to leave the floating gate as shown.

Figure 9A:
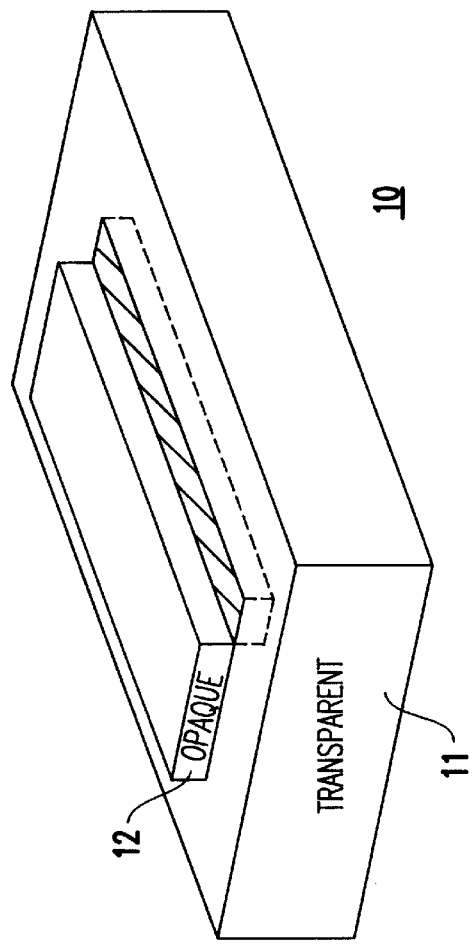
FIGS. 9A and 9B are a perspective view and a top view, respectively, of a phase-shift mask structure 10 for creating controlled tapered structures.
Figure 9B:
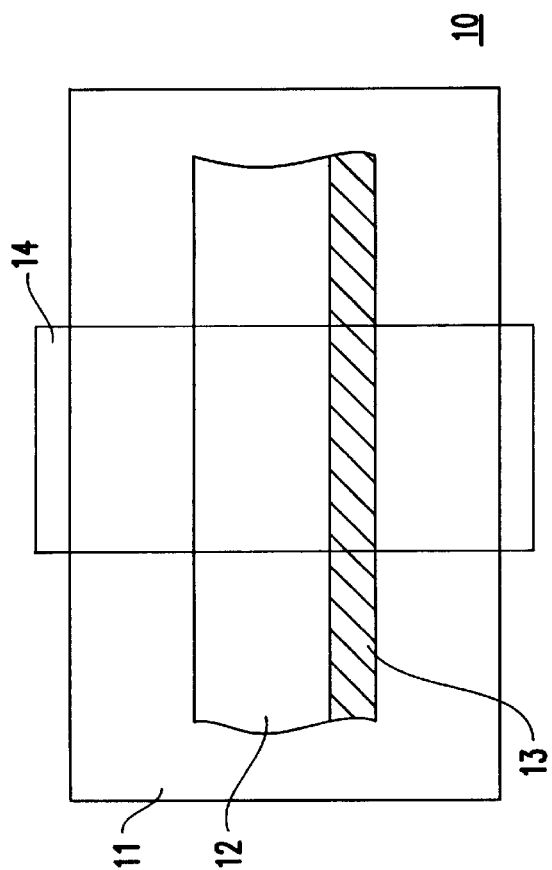

A three-dimensional diagram of the mask structure 10 to create controlled tapered structures is shown in FIG. 9A. The phase shift region 13 of the mask are on the transparent substrate 11, made of quartz or the like, where tapered shapes are required. The opaque mask 12, made of chrome or the like, without phase shift modifications are regions where vertical sidewalls are required. The location of trim mask 14 is shown in FIG. 9B.

Figure 10:
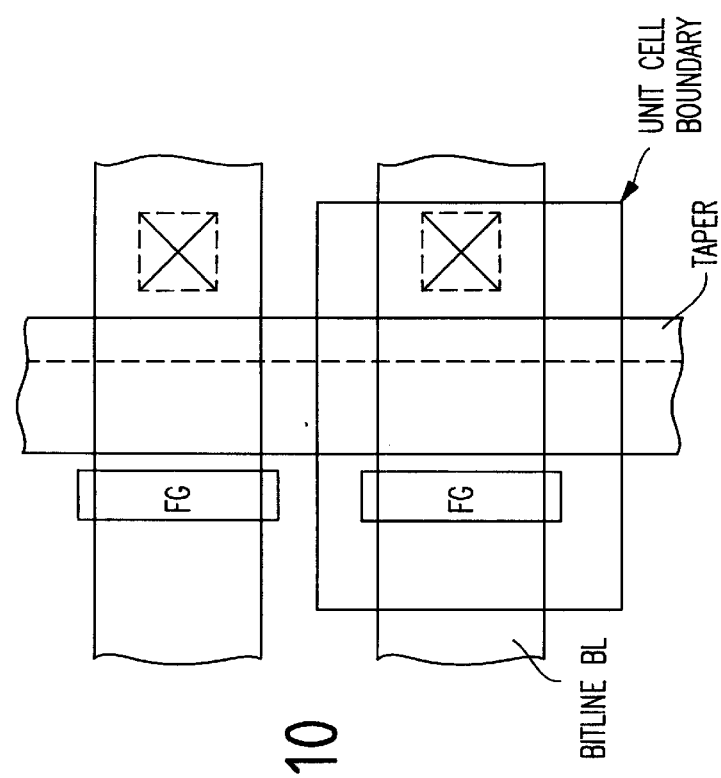
FIG. 10 illustrates a final layout structure of the method of forming a semiconductor device, such as a flash memory, according to the present invention.

FIG. 10 illustrates the discrete floating gates formed on the vertical sidewall of the structure.

Thus, a three-dimensional diagram of the mask structure 10, including a transparent region 11 and an opaque region 12, to create controlled tapered structures is shown in FIG. 9A. A phase shift region 13 of the mask is on the transparent substrate 11 (e.g., formed of quartz or the like) where tapered shapes are required. The opaque region 12 (e.g., mask portion formed of a metal such as chrome or the like) without phase shift modifications are regions where vertical sidewalls are required. A top view of the mask is shown in FIG. 9B.

The details of the lithographic technique for making the sloped sidewalls of the gate conductor line, as shown in FIG. 8A, are known, and, for example, are described in the above-mentioned U.S. patent application Ser. No. 09/010,611, filed on Jan. 22, 1998 by IBM Corporation, and entitled "MULTI-PHASE MASK", incorporated herein by reference.

Figure 12:
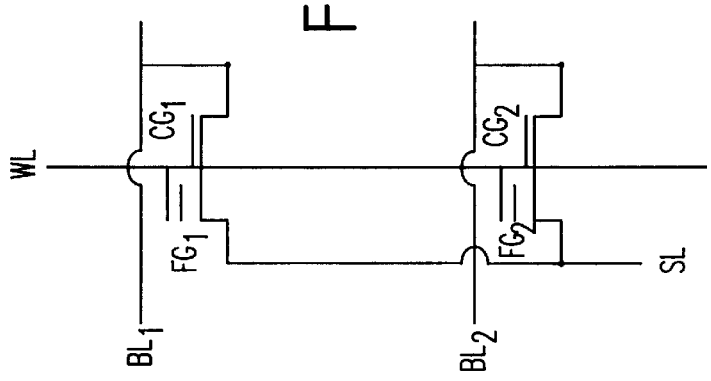
FIG. 12 schematically illustrates a circuit formed by the inventive method of the present invention.
Figure 11:
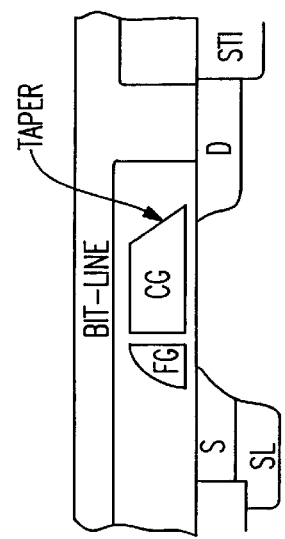
FIG. 11 illustrates a device cross-section of the device shown in FIG. 3.

The final layout structure, device cross-section of the final layout structure, and circuit schematic are shown in FIGS. 10, 11 and 12, respectively. FIGS. 10 and 12 illustrate two adjacent cells which share a wordline.

FIG. 12 illustrates a schematic in which two adjacent flash memory cells are shared by the same wordline WL. The first cell has a first bitline $BL_1$ and control gate $CG_1$ and floating gate $FG_1$. The second cell has a second bitline $BL_2$, control gate $CG_2$ and a floating gate $FG_2$. The sources of the two cells are joined by a source line SL which is used for cell erasure.

With the method and structure of the first embodiment of the present invention, the pattern density of the flash memory can be significantly improved. The method according to the present invention not only eliminates the tight tolerance of trim masks, but also provides greater flexibility of cell layout, which is suitable for a very high density flash memory integration.

Further, the inventive flash memory formed by the method of the invention includes a control gate (the gate conductor) which abuts the floating gate (FG) on one side (e.g., as most clearly shown in FIGS. 8A and 10). Additionally, the FG is fabricated to have an extremely small size, and is self-isolated from adjacent FG devices by the gate conductor. This is advantageous in terms of greater integration and performance reliability.

The present invention produces a flash memory in which the floating gates are formed discretely in desired positions on the substantially vertical sidewall (or sidewall having a slope greater than that of the tapered sidewall) on a plurality of sides, and having the advantages described above. The floating gates are isolated from each other by their discrete positioning along the substantially vertical (e.g., relatively steeper) sidewall.

With the unique and unobvious features of the methods of the present invention, a flash memory according to the present invention is shown, which includes a floating gate which is a sidewall spacer region of polysilicon formed on a vertical sidewall of the gate conductor/control gate (CG), after the CG is lined with thin layers of nitride and oxide as a gate dielectric.

As mentioned above, FIGS. 9A and 9B show a phase shift mask used to define the gate conductor, leaving a vertical sidewall where the FG will be formed as a discrete polysilicon sidewall spacer, and forming a gate conductor with tapered sidewalls in all other areas. Each of the floating gates FG is suitably spaced from adjacent floating gates FG.

Thus, the present invention includes a method in which a polysilicon body is provided with sloping (e.g., tapered) sidewalls in certain regions and steep (perpendicular) sidewalls in the remaining regions. Additionally, by using the inventive method a very high density flash memory can be designed and fabricated with less process steps and a low manufacturing cost. Hence, the inventive techniques can significantly improve the pattern density of flash memory.

While the invention has been described in terms of a preferred embodiment, those skilled in the art will recognize that the invention can be practiced with modification within the spirit and scope of the appended claims.

What is claimed is:

1. A method of forming a flash memory, comprising:

depositing a polysilicon material over a gate oxide on a substrate such that said polysilicon material is patterned to form a wordline having first and second sidewalls, said first sidewall being tapered, with respect to a surface of said substrate, to have a slope angle and said second sidewall having a slope angle greater than said slope angle of said first sidewall; and depositing a polysilicon layer over said wordline and etching said polysilicon layer to form a polysilicon spacer on said second sidewall such that only one said polysilicon spacer abuts said wordline, said polysilicon spacer being spaced from said wordline by an oxide layer therebetween, wherein said polysilicon spacer forms a floating gate, and wherein a periphery of said floating gate is surrounded by said wordline as a control gate.

2. The method according to claim 1, wherein said forming the wordline includes using a phase-shift mask with a trim mask.

3. The method according to claim 1, wherein said forming the polysilicon spacer includes using a trim mask.

4. The method according to claim 1, said second sidewall comprises a substantially vertical sidewall.

5. The method according to claim 1, wherein said forming the first sidewall with a slope angle comprises forming said slope angle to be substantially within a range of 45 to 65 degrees with respect to a surface of said substrate on which said first sidewall is formed.

6. The method according to claim 1, wherein said etching to form the polysilicon spacer includes etching to form said polysilicon spacer discretely along said second sidewall such that said polysilicon spacer abuts said second sidewall along only one side thereof.

7. A method of forming a flash memory having a plurality of cells, comprising:

forming a substrate with well and isolation structures;

forming, by thermal oxidation, a gate oxide over said substrate;

depositing a polysilicon gate material on said gate oxide, and patterning said polysilicon gate material to form a polysilicon control gate, said control gate including a substantially vertical first sidewall of the gate and a tapered second sidewall;

selectively etching the gate oxide in an exposed area, and depositing a gate dielectric;

performing a thermal oxidation such that oxygen is diffused through said gate dielectric, and such that at an interface of said gate dielectric, the polysilicon gate material and said substrate, an oxide layer is grown devoid of a dangling bond; and selectively forming at least one sidewall floating gate on said oxide layer by a spacer process including a polysilicon deposition followed by an etching, and using a trim mask to form said at least one floating gate where desired, and forming a tunneling region underneath the floating gate, wherein said at least one sidewall floating gate includes only one side which abuts said control gate at said substantially vertical first sidewall, wherein a periphery of said floating gate is surrounded by said control gate.

8. The method according to claim 7, further comprising:

performing source and drain implants; and forming a dielectric and an interconnect for a bitline of said flash memory, wherein said forming a substrate comprises forming a silicon substrate and said depositing a gate dielectric comprises depositing a nitride layer, wherein a mask structure is used to create a tapered structure, the mask structure including phase shift regions which are positioned on the substrate where tapered shapes are required and an opaque mask without phase shift modifications at regions where the vertical sidewall is formed.

9. The method according to claim 8, wherein said silicon substrate includes an implanted $n^+$ diffusion region, said $n^+$ diffusion region being for a source connection of cells of said flash memory.

10. The method according to claim 8, wherein said silicon substrate includes one of tungsten, silicide and a buried interconnect scheme for a source connection of cells of said flash memory.

11. The method according to claim 9, wherein said oxide layer has a thickness within a range of 2 to 5 nm, and said tapered second sidewall has a slope angle with respect to a surface of said substrate on which said control gate is mounted substantially between about 45 and 65 degrees, and wherein said forming a sidewall floating gate using a spacer process includes depositing a polysilicon material followed by reactive ion etching (RIE) thereof, to form a polysilicon spacer.

12. A method of forming a flash memory having a plurality of cells, comprising:

forming a substrate with well and isolation structures;

forming a gate oxide over said substrate;

depositing a polysilicon gate material on said gate oxide, to form a control gate, said control gate including a substantially vertical first sidewall of the gate and a tapered second sidewall;

selectively removing the gate oxide in an exposed area, and depositing a gate dielectric;

performing a thermal oxidation such that at an interface of said gate dielectric, and the polysilicon gate material and said substrate, an oxide layer is grown;

forming a sidewall floating gate, and forming a tunneling region underneath the floating gate;

performing source and drain implants; and forming a dielectric and an interconnect for a bitline of said flash memory, wherein said sidewall floating gate includes only one side which abuts said control gate at said substantially vertical first sidewall, wherein said silicon substrate includes an implanted $n^+$ diffusion region, said $n^+$ diffusion region being for a source connection of cells of said flash memory, wherein said forming a substrate comprises forming a silicon substrate and said depositing a gate dielectric comprises depositing a nitride layer, wherein a mask structure is used to create a tapered structure, the mask structure including phase shift regions which are positioned on the substrate where tapered shapes are required and an opaque mask without phase shift modifications at regions where the vertical sidewall is formed, wherein said silicon substrate includes an implanted $n^+$ diffusion region, said $n^+$ diffusion region being for a source connection of cells of said flash memory, wherein said oxide layer has a thickness within a range of 2 to 5 nn, and said tapered second sidewall has a slope angle with respect to a surface of said substrate on which said control gate is mounted substantially between about 45 and 65 degrees, wherein said forming a sidewall floating gate using a spacer process includes depositing a polysilicon material followed by reactive ion etching (RIE) thereof, to form a polysilicon spacer, wherein said gate dielectric comprises a nitride layer and said tunneling region is formed by a double spacer process, the double spacer process comprising forming a first spacer on top of the nitride layer/oxide layer, removing the nitride layer, and leaving said oxide layer as a tunnel oxide layer before forming a second polysilicon spacer, and wherein said double spacer process provides the tunneling oxide located relatively remote from the control gate and relatively adjacent a source area, and the nitride layer between the control gate and the floating gate is protected by the first spacer during the nitride layer removal.

* * * * *